United States Patent
Smith et al.

(10) Patent No.: US 7,833,806 B2
(45) Date of Patent: Nov. 16, 2010

(54) STRUCTURE AND METHOD FOR FABRICATING CLADDED CONDUCTIVE LINES IN MAGNETIC MEMORIES

(75) Inventors: Kenneth H. Smith, Chandler, AZ (US); Nicholas D. Rizzo, Gilbert, AZ (US); Sanjeev Aggarwal, Scottsdale, AZ (US); Anthony Ciancio, Gilbert, AZ (US); Brian R. Butcher, Queen Creek, AZ (US); Kelly Wayne Kyler, Mesa, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 22 days.

(21) Appl. No.: 12/363,404

(22) Filed: Jan. 30, 2009

(65) Prior Publication Data
US 2010/0197043 A1     Aug. 5, 2010

(51) Int. Cl.
*H01L 21/00* (2006.01)
(52) U.S. Cl. ............... 438/3; 438/978; 257/E43.004; 257/E21.665
(58) Field of Classification Search ............... 438/3, 438/978; 257/E43.004, E21.665
See application file for complete search history.

(56) References Cited

U.S. PATENT DOCUMENTS

| | | | |
|---|---|---|---|
| 5,659,499 | A |   8/1997 | Chen et al. |
| 5,798,559 | A * | 8/1998 | Bothra et al. ............ 257/522 |
| 6,174,737 | B1 * | 1/2001 | Durlam et al. ........... 438/3 |
| 6,211,090 | B1 |   4/2001 | Durlam et al. |
| 6,806,096 | B1 * | 10/2004 | Kim et al. ............. 438/3 |
| 6,806,127 | B2 | 10/2004 | Butcher et al. |
| 6,881,351 | B2 |   4/2005 | Grynkewich et al. |
| 7,118,988 | B2 * | 10/2006 | Buerger et al. ........... 438/437 |
| 7,129,098 | B2 | 10/2006 | Rizzo et al. |
| 2002/0186582 | A1 | 12/2002 | Sharma et al. |
| 2005/0274997 | A1 * | 12/2005 | Gaidis et al. ........... 257/295 |
| 2008/0096290 | A1 |   4/2008 | Smith et al. |
| 2010/0047929 | A1 * | 2/2010 | Hong et al. ........... 438/3 |

OTHER PUBLICATIONS

PCT International Search Report for PCT/US10/21979 mailed Mar. 22, 2010.

* cited by examiner

*Primary Examiner*—W. David Coleman
*Assistant Examiner*—Christine Enad
(74) *Attorney, Agent, or Firm*—Ingrassia Fisher & Lorenz, P.C.

(57) ABSTRACT

A method of forming a magnetoelectronic device includes forming a dielectric material (114) surrounding a magnetic bit (112), etching the dielectric material (114) to define an opening (122) over the magnetic bit (112) without exposing the magnetic bit (112), the opening (122) having a sidewall, depositing a blanket layer (132) of cladding material over the dielectric material (118), including over the sidewall, removing by a sputtering process the blanket layer (132) in the bottom of the opening (122) and the dielectric material (124) over the magnetic bit (112), and forming a conductive material (146) within the opening (122) to form a bit line (154). This process reduces errors caused by process irregularities such as edges of the bits (112) protruding and thereby causing defects in the cladding layer (132) formed thereover. A bit line or digit line so formed may optionally be tapered at the ends (182, 184) to prevent magnetic reversal of the bit line magnetic moment that otherwise may occur due to external magnetic fields.

20 Claims, 3 Drawing Sheets

STRUCTURE AND METHOD FOR FABRICATING CLADDED CONDUCTIVE LINES IN MAGNETIC MEMORIES

FIELD OF THE INVENTION

The present invention generally relates to magnetic memories and more particularly to an array of magnetic memory bits having reduced soft errors.

BACKGROUND OF THE INVENTION

Magnetoelectronic devices often make use of current carrying conductive lines to generate magnetic fields that affect the devices. Such devices can include magnetic field sensors, magnetoresistive random access memory (hereinafter referred to as "MRAM") devices, or the like, and typically utilize the orientation of a magnetization vector for device operation. In MRAM devices, for example, storing data is accomplished by applying magnetic fields and causing a magnetic material in the MRAM device to be magnetized into either of two possible memory states. The magnetic fields for writing are created by passing currents through conductive lines external to the magnetic structure or through the magnetic structures themselves.

To reduce the current needed to generate a given magnetic field, the conductive lines are often surrounded on three sides with a magnetic layer of high permeability. Such a layer is referred to as a cladding layer and it typically reduces the current needed for a given magnetic field by a factor of two or more. Therefore, a cladding layer is highly desirable for a low power MRAM, as well as a high density MRAM, since lower currents enable smaller transistors and longer conductive lines for programming.

Normally, the cladding material has a magnetic moment in one direction along an axis of the material and the bit is influenced by only the fields created by the current in the bit and digit lines during programming. However, previously known cladding structures and the process for forming the cladding material may introduce errors (sometimes referred to as soft errors) in the writing or sensing of the magnetic bits. Process steps using an etch to provide electrical contact to a bit, for example, may result in the bit top electrode extending above the surrounding dielectric material, so that a bump occurs in the cladding material subsequently placed thereon. Such a bump can produce a non-uniform magnetization state in the cladding, thereby changing the field it produces. Additionally, the cladding material structure may experience a magnetic field reversal in one or more locations due to a particularly strong external field. An external magnetic field may cause the magnetic moment in portions of the cladding material surrounding the conductive line to reverse, creating a domain wall. This domain wall, when contiguous to a bit, may also changes the field produced by the cladded line.

These changes in the uniform magnetic state of the cladding can introduce errors during programming of the MRAM cells. For example, the field produced by the cladding may be reduced, so that the total field incident to the MRAM device may be less than that required for writing which can cause programming errors. Additionally, a field may be generated by the cladding even in the absence of current in the conductor, which can also cause programming errors. A typical MRAM architecture has multiple bits that are exposed to magnetic fields when one MRAM device is programmed. These one-half selected MRAM devices are particularly sensitive to unintended programming from a remnant magnetic field due to cladding. Further, if the magnetic field from the cladding is large enough, MRAM devices may be unintentionally switched by the cladding field even in the absence of a programming current.

Accordingly, it is desirable to provide a structure and fabricating method for cladded conductive lines that are less likely to produce programming errors. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method of forming a magnetoelectronic device includes forming a dielectric material surrounding a magnetic bit, etching the dielectric material to define an opening over the magnetic bit without exposing the magnetic bit, the opening having a sidewall, depositing a blanket layer of cladding material over the dielectric material, including over the sidewall, removing by a sputtering process the blanket layer in the bottom of the opening and the dielectric over the magnetic bit, and forming a conductive material within the opening to form a bit line. This process reduces errors caused by process irregularities such as edges of the bits protruding and thereby causing defects in the cladding layers formed thereover. A bit line or digit line so formed may optionally be tapered at the ends to prevent magnetic reversal of the bit line magnetic moment that otherwise may occur due to external magnetic fields.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
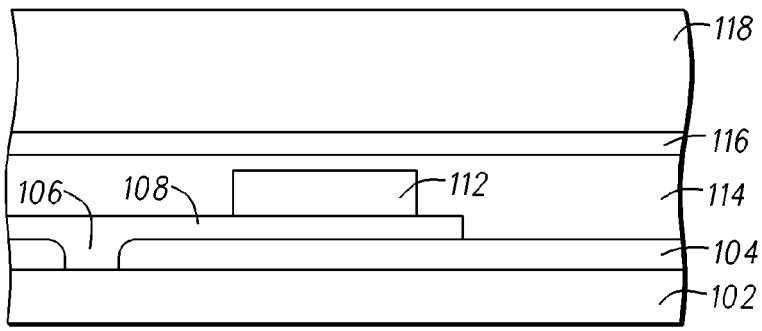
FIGS. 1-6 are cross sectional views of a bit and its related bit and digit lines fabricated with a process in accordance with an exemplary embodiment.

The following detailed description of the invention is merely exemplary in nature and is not intended to limit the invention or the application and uses of the invention. Furthermore, there is no intention to be bound by any theory presented in the preceding background of the invention or the following detailed description of the invention.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

The magnetic random access memory (MRAM) array described herein, and the process for fabricating the MRAM bits and surrounding structures, reduces errors caused by 1) process irregularities such as edges of the bits protruding and thereby causing defects in the cladding layers formed thereover, or by 2) partial reversal of the bit line or digit line magnetic moment due to external fields. The process includes etching through a dielectric and an etch stop layer to create an opening above each of the bits and wherein a flat surface of the dielectric remains above each of the bits. A blanket layer of cladding material such as nickel iron (NiFe) is deposited over and on the sides of the dielectric and on the sides of the etch stop layer. The opening is sputtered to remove the cladding material and the dielectric remaining to make contact to the bit. A conductive material (bit line) is then formed within the opening and is planarized with a CMP process. A cladding "cap" is then formed over the conductive material. This process may also be used to form a via directly to the digit line beneath the bit. The ends of the bit lines are tapered to prevent magnetic reversal of the bit line magnetic moment that otherwise may occur due to external magnetic fields. Note that the tapering of the ends of the cladded line can also be done to the cladded digit lines beneath the bit. For simplicity, the tapering will only be described hereafter for bit lines.

Though the exemplary embodiment of is described with reference to MRAM, it may also be used in and with magnetic sensors.

Referring to FIG. 1, a plurality of digit lines 102 are formed, for example, over a substrate (not shown). A dielectric layer 104 is deposited over the digit lines to electrically isolate the digit line 102 and conductive layer 108 from one another. A via 106 is created within the dielectric layer 104 so that a conductive layer 108 can couple the digit lines 102 to the magnetic bits 112 formed over the conductive layer 108. A dielectric layer 114 is deposited over the magnetic bits 112, conductive layer 108, and dielectric layer 104. An etch stop layer 116 is deposited over the dielectric layer 114 and another dielectric layer 118 is deposited over the etch stop layer 116 to form the structure 100.

In the exemplary embodiment, the dielectric layers 104, 114, 118 may be silicon oxide, silicon nitride (SiN), silicon oxynitride (SiON), a polyimide, or combinations thereof. The digit lines 102 are preferably copper and the conductive layer 108 is preferably tantalum, but it will be understood that they may be other materials such as silver, gold, aluminum, platinum, or another suitable conductive material. Typically, the digit lines are deposited by physical vapor deposition or plating or another suitable technique well known to those skilled in the art. The etch stop layer preferably is silicon nitride, but may be any material that etches slower than the dielectric layer 118. The magnetic bits 112, as is known to those skilled in the art, typically are formed of two magnetic regions (not shown) separated by a spacer layer (not shown). A thin layer (not shown) of a conductive material, such as tantalum may be deposited over the top magnetic region. The magnetic bit 112 may include additional magnetic and non-magnetic layers. An example of a magnetic bit is disclosed in U.S. Pat. No. 7,129,098.

Figure 2:
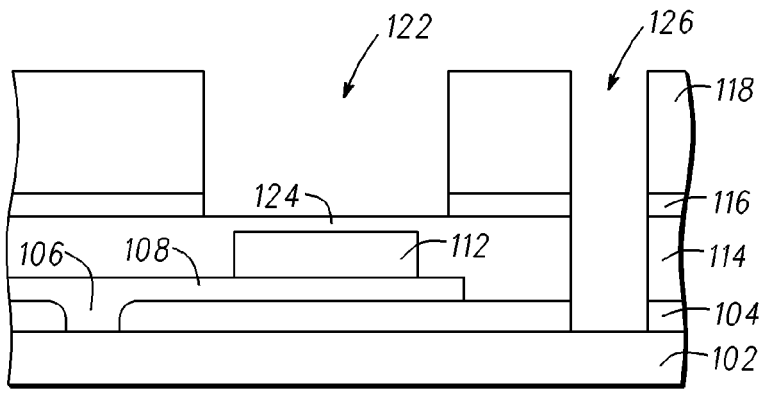

Referring to FIG. 2, an etch is performed to create the opening 122 in the dielectric layer 118 and stopping in the etch stop layer 116, leaving a portion 124 of the dielectric layers 114 and 116 over the magnetic bit 112. The etch also creates a via 126 through the dielectric layer 118 and etch stop layer 116. The via 126 is extended through the dielectric layers 114, 104 down to the digit lines 102. More specifically, a dual damascene process etches through the etch stop layer 116. Photo resist is placed in the opening 122 while the via 126 is further etched, resulting in the structure 200. A clean process comprising DI water or neutral oxide etch (NOE) chemistry may be used after the via etch to remove any etch residue or polymer.

Figure 3:
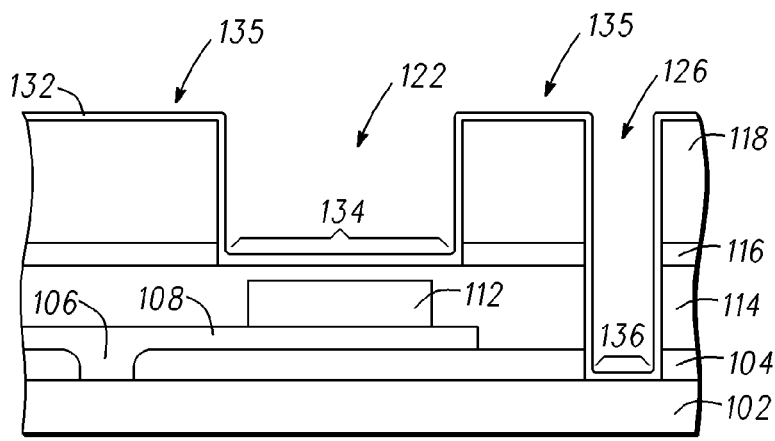
Figure 4:
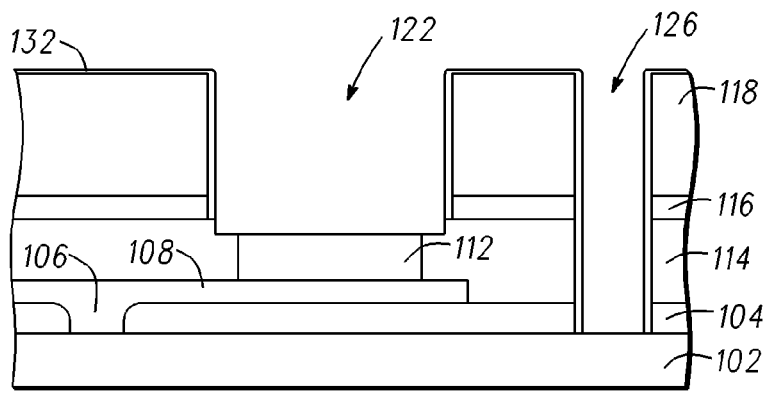

A blanket layer 132 is then deposited over the structure 200 as shown in FIG. 3. The blanket layer 132 is a cladding material, preferably a nickel iron alloy of typical composition $Ni_{81}Fe_{19}$, but other high permeability magnetic materials can be used, such as alloys of NiFeCo, CoFeB, or the like. A sputter is performed to remove the portion 134 (and most of portion 135 that is deposited on layer 118 across the wafer) of the blanket layer 132 and the portion 124 of the dielectric layer 114 in the opening 122 overlying the magnetic bit 112, and to remove the portion 136 of the blanket layer 132 in the via 126 overlying the digit line 102 (see FIG. 4).

The sputter process removes dielectric material 104 at a faster rate that bit electrode 112, so that the bit 112 protrudes slightly from the bottom of opening 122. By depositing the cladding material on the flat surface of etch stop layer 116 and removing portion 134 before the bit is exposed, the possibility of a bump in the bottom of the cladding sidewall caused by the bit 122 protrusion is eliminated.

In the via 126, the sputter process etches into the interconnect metal 102 of the digit line. This over-etch anchors the via 126 into the digit line 102 leading to above average EM performance. The sputter in the via 126 is a self-limiting process that stops when the walls reach 45 degrees.

Figure 5:
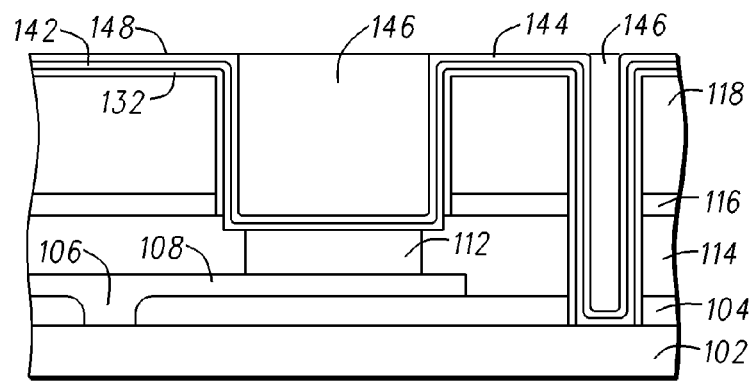
Figure 6:
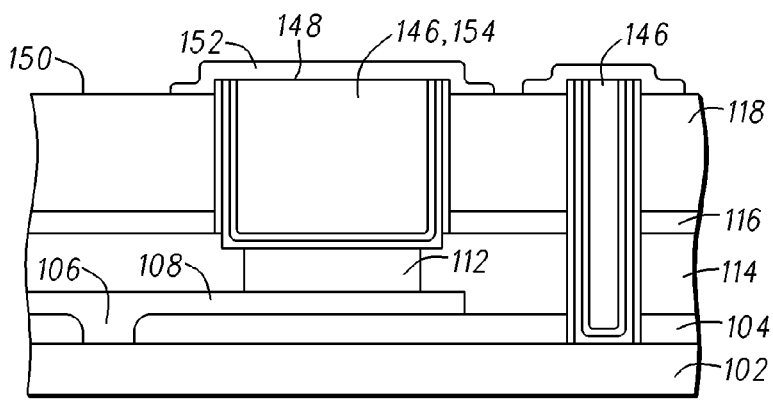

A blanket layer 142 of tantalum and a blanket layer 144 of a copper seed material is deposited (FIG. 5) over the blanket layer 118, magnetic bit 112 within the opening 122, and the digit line 102 within the via 126. The tantalum makes electrical contact to the bit and isolates the copper seed material from the nickel iron of the cladding material (blanket layer 132). Bulk copper 146 is then formed within the opening 122 and the via 126 and polished to a level surface 148. The CMP process removes all the layers above 118. The surface 148 is exposed (FIG. 6) to an NOE of ethylene glycol and ammonium fluoride, and a citric solution, to remove a portion of the dielectric layer 118 so the dielectric layer 118 has a top surface 150 below that of surface 148. A cladding material 152 is deposited across the wafer covering the copper material 146 and the surface 150. A photo and etch process is used to remove the layer 152 from everywhere, except on top of the bit line 154. The copper material 146 is the bit line 154. The cladding material 152 mates with the blanket layer 132 of cladding material to form a "U" shaped shield around the bit line 154 to protect the bit line 154 from external magnetic fields.

Alternatively, instead of performing a neutral oxide etch, the difference in levels of the surfaces 148 (bit line 154) and 150 (dielectric layer) may be accomplished by a CMP. The CMP process after Cu bulk fill layer 146 is a three step process run on three different platens. Step 1 is a bulk removal rapid process leaving about 2000 A of Cu across the wafer. Step 2 removes the balance of the Cu and end points on the Ta layer 142. Step 3 removes the Ta layer 142, stopping in the dielectric layer 118. This process (step 3) is optimized to create a step so that the top surface 150 is below that of surface 148. To achieve this step, the hydrogen peroxide content of the slurry is controlled between 0.3 and 1.2%. Alternatively, soft pads can be used on platen 3 to achieve the same effect.

While only one digit line 102 and one bit line 154, and one bit 112 are shown in the FIGS., it is understood that a plurality of bits 112 are uniquely disposed between a plurality of digit lines 102 and a plurality of bit lines 154.

Figure 7:
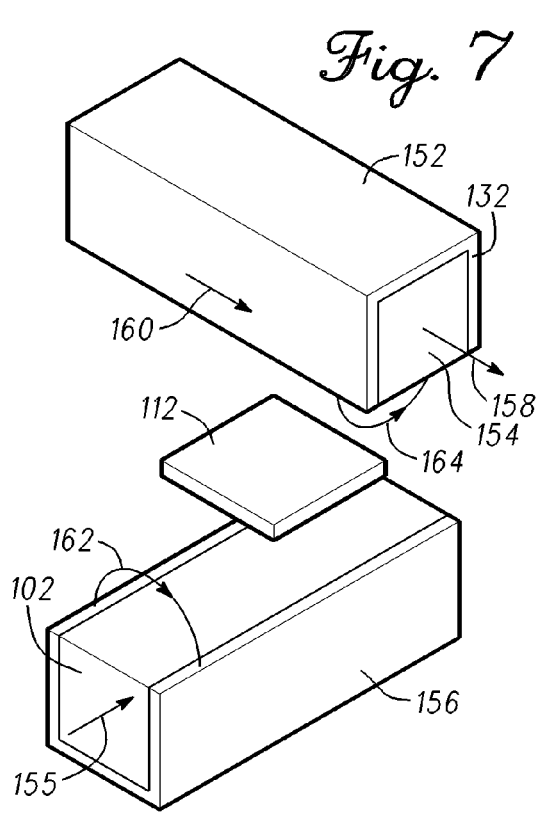
FIG. 7 is a representative illustration of a bit being programmed by cladded digit and bit lines in a magnetic memory.

FIG. 7 shows the bit line 154 partially surrounded by the blanket layer 132 and capping layer 152 of cladding material. The digit line 102 may also be partially surrounded by cladding material 156. For clarity, the bit line 154 and the digit line 102 are displaced from the bit 112. It is seen that when a current 155 flows as indicated in the digit line 102, a magnetic field 162 is created, and when a current 158 flows in the bit line 154, a magnetic field 164 is created. These magnetic fields 162 and 164 influence the magnetic bit 112.

Figure 8:
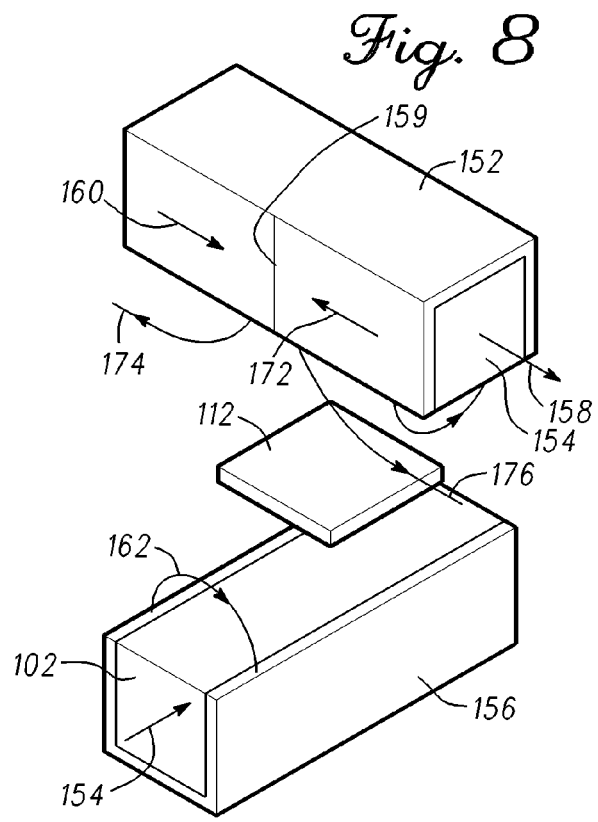
FIG. 8 is a representative illustration of a bit being programmed by cladded digit and bit lines in a magnetic memory wherein the bit line cladding has a partially reversed magnetic moment.

When a reversal of the magnetic moment occurs in the cladding material 132 and 152 of the bit line 154 as may be created by external magnetic fields, and as shown by the reverse magnetic moment 172 in FIG. 8, opposed magnetic fields 174 and 176 undesirably influence the magnetic bit 112. Note that the head-to-head domain wall shown is chosen for simplicity, and is one of several possible magnetization configurations for the cladding after partial magnetization reversal, all of which will generate magnetic field at the bit in absence of current. While the bit field influencing the magnetic bit 112 in FIG. 7 is generated only by the current 158 and the response of the cladding layers 132 and 152, the field influencing the magnetic bit 112 in FIG. 8 is generated by the current 158, the response of the cladding layers 132 and 152, and the domain wall 159 (between the fields 174, 176) in the cladding 132 and 152. In addition, the cladding near the domain wall will not respond to the field from current in the same way that a uniformly magnetized cladding will respond. In general, it can be seen that magnetization reversal of the cladding is to be avoided for error free MRAM programming.

Figure 9:
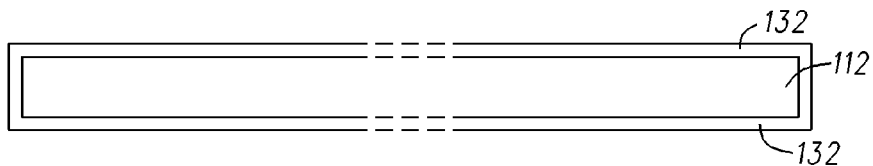
FIG. 9 is a top view of a known bit line.
Figure 10:
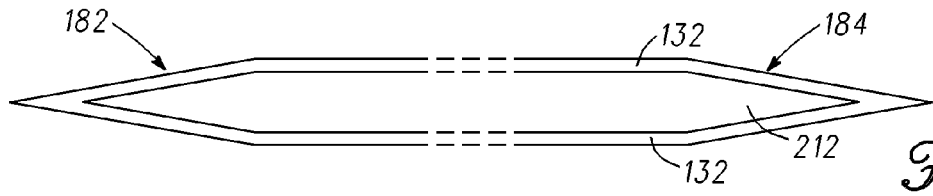
FIG. 10 is a bottom view of the bit line in accordance with an exemplary embodiment.
Figure 11:
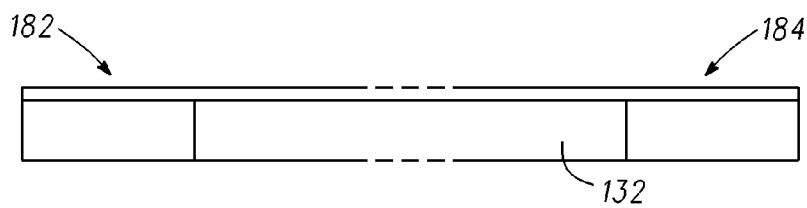
FIG. 11 is a side view of the bit line of FIG. 10.

When the end of bit line 112 is boxed shaped as seen in FIG. 9 (bottom view), a reversal of the magnetic moment is possible in relatively small external magnetic field. However, when the ends 182, 184 (FIG. 10 bottom view and FIG. 11 side view) of the bit lines 154 are tapered using lithographic processes, a magnetic moment reversal does not occur until the cladding is exposed to much larger external magnetic fields. The tapered portion preferably has a length to width ratio of at least 2.

Figure 12:
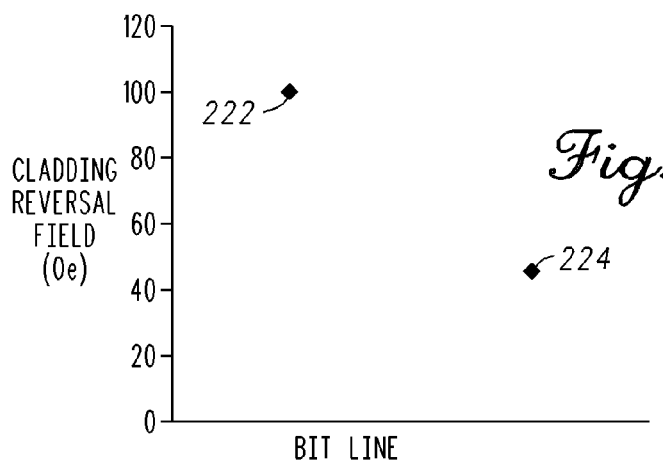
FIG. 12 is a graph showing the cladding reversal field for the known bit line of FIG. 9 and the bit line of FIGS. 10 and 11.
Figure 13:
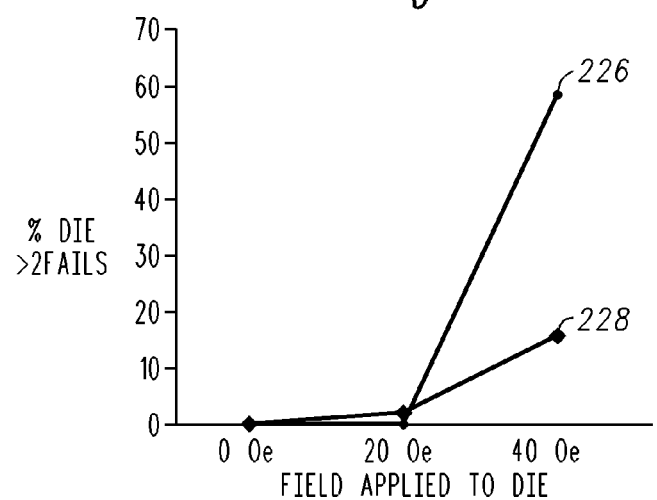
FIG. 13 is a graph showing the percent die failures greater than 2 versus the external magnetic field applied to the die for the bit line of FIG. 9 and the bit line of FIGS. 10 and 11.

FIG. 12 illustrates the difference in cladding reversal field in oersteds for a bit line having tapered ends 222 which has a magnitude of about 100 Oe versus for a bit line having non-tapered ends 224 which has a magnitude of about 45 Oe. FIG. 13 illustrates the percentage of die having more than two failures during a standard memory test verses the magnetic field applied to the die in a direction to reverse the bit line cladding. The magnetic field is applied and removed before the wafer is tested. It is seen that at 40 Oe, the bit lines having non-tapered ends 226 have about 60 percent failures while the bit lines having tapered ends 228 have only about 16 percent failures.

Modifying the shape of the ends affects the magnetization reversal field of the cladding since by symmetry, magnetization reversal is initiated at the ends of the lines. In addition, for shielded die an external magnetic field will be largest at the edges of the die first, so that magnetization reversal will most likely occur at the ends of the cladded lines. The effect of tapering the lines is to produce a more uniform magnetization state parallel to the line length. A flat (untapered) line end is more likely to have magnetic flux closure domains with spatially non-uniform magnetization. In general, the largest reversal fields occur for uniformly magnetized structures, since these are more likely to generate the maximum shape anisotropy preventing magnetization reversal, and they are more likely to reverse coherently which also requires larger external reversal fields.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for forming a magnetoelectronic device comprising:
    forming a dielectric material surrounding a magnetic bit;
    etching the dielectric material to define an opening over the magnetic bit without exposing the magnetic bit, the opening defining an elongated channel having a sidewall, a bottom near the magnetic bit, and first and second ends, including the step of:
        tapering the sidewall of the opening at the first and second ends;
    depositing a blanket layer of cladding material over the dielectric material, including over the sidewall;
    removing by a sputtering process the blanket layer in the bottom of the opening and the dielectric over, and to expose, the magnetic bit; and
    forming a conductive material within the opening to form a bit line having a first tapered end within the first end of the opening and a second tapered end within the second end of the opening.

2. A method of forming an array of magnetic bits comprising:
    forming a plurality of bit lines having first and second ends;
    forming a plurality of digit lines having first and second ends;
    forming a plurality of magnetic bits, each of the magnetic bits uniquely coupled between the first and second ends of one of the bit lines and the first and second ends of one of the digit lines;
    forming a cladding material partially surrounding at least either the bit lines or the digit lines; and
    tapering at least one of the first and second ends of at least either the bit lines or the digit lines and the cladding material thereon.

3. A method of forming an array of magnetic bits comprising:
- forming a plurality of digit lines over a substrate;
- forming a plurality of rows of magnetic bits, each row of magnetic bits uniquely disposed over and in electric contact with one of the digit lines;
- forming a dielectric material over the digit lines and the magnetic bits;
- etching the dielectric material to create an opening over each of the magnetic bits and at an angle to the digit lines defining a plurality of columns, the opening having sidewalls with a diameter larger than the magnetic bit, a bottom near the magnetic bits, and first and second ends of each column, wherein a portion of the dielectric material remains over the magnetic bits, including:
  - tapering the sidewall of at least one of first and second ends;
- depositing a blanket layer of cladding material on the dielectric material including the sidewalls and the first and second ends;
- sputtering to remove the cladding material and the dielectric material over the magnetic bit;
- depositing a conductive material as a bit line within each of the openings and at an angle to the digit lines, wherein each of the magnetic bits are uniquely coupled between a bit line and a digit line, at least one of the bit lines having a tapered end within each of the first and second ends; and
- forming a capping layer of the cladding material over the bit lines.

4. The method of claim 1 wherein the tapering step comprises:
- creating a tapered portion having a length to width ratio of at least two.

5. The method of claim 1, prior to the forming a conductive material, further comprising:
- forming a layer of tantalum on the sidewall and over the magnetic bits; and
- forming a layer of a seed material over the layer of tantalum.

6. The method of claim 1 wherein the depositing step comprises:
- depositing a blanket layer of nickel iron.

7. The method of claim 1 wherein the removing step comprises:
- applying a neutral oxide etch.

8. The method of claim 1 further comprising:
- performing a chemical mechanical polish subsequent to the forming a conductive material.

9. The method of claim 1 wherein the etching the dielectric material step further defines a second opening to a conductive layer therebelow, the depositing step further comprises depositing the blanket layer over the conductive layer and the second sidewall, the removing step further comprising removing by the sputtering process the blanket layer to expose the conductive layer, and the forming a conductive material step further comprising forming the conductive material within the second opening to make contact with the conductive layer.

10. The method of claim 1 further comprising:
- forming a capping layer of the cladding material over the conductive material, the capping layer mating with the cladding material on the sidewalls of the conductive material.

11. The method of claim 10 wherein the bit lines have first and second ends, further comprising:
- tapering the capping layer at the first and second ends.

12. The method of claim 11 wherein the tapering step comprises:
- creating a tapered portion having a length to width ratio of at least two.

13. The method of claim 2 wherein the tapering step comprises:
- creating a tapered portion at the at least of first and second ends having a length to width ratio of at least two.

14. The method of claim 3 wherein the bit lines have first and second ends, further comprising:
- tapering the capping layer of the at least one of the first and second ends.

15. The method of claim 14 wherein the tapering step comprises:
- creating a tapered portion having a length to width ratio of at least two.

16. The method of claim 3 wherein the tapering step comprises:
- creating a tapered portion having a length to width ratio of at least two.

17. The method of claim 3, prior to the forming a conductive material, further comprising:
- forming a layer of tantalum on the sidewall and over the magnetic bits; and
- forming a layer of a seed material over the layer of tantalum.

18. The method of claim 3 wherein the sputtering step comprises:
- applying a neutral oxide etch.

19. The method of claim 3 further comprising:
- performing a chemical mechanical polish subsequent to the depositing a conductive material.

20. The method of claim 3 wherein the forming a dielectric material further defines a second opening to a conductive layer therebelow,
- the depositing step further comprises:
  - depositing the blanket layer over the conductive layer including a second sidewall;
- the sputtering step further comprising:
  - removing by the sputtering process the blanket layer to expose the conductive layer; and
- the depositing a conductive material step further comprising:
  - forming the conductive material within the second opening to make contact with the conductive layer.

* * * * *